(12) United States Patent
Loheit et al.

(10) Patent No.: US 7,542,511 B2
(45) Date of Patent: *Jun. 2, 2009

(54) WIRELESS RF LINK FOR UNCOMPRESSED TRANSMISSION OF HDTV SIGNALS

(75) Inventors: Kurt W. Loheit, Rolling Hills Estate, CA (US); William A. Salter, Torrance, CA (US)

(73) Assignee: The Boeing Company, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/554,900

(22) Filed: Oct. 31, 2006

(65) Prior Publication Data

US 2007/0053447 A1 Mar. 8, 2007

Related U.S. Application Data

(63) Continuation of application No. 10/406,931, filed on Apr. 3, 2003, now Pat. No. 7,139,319.

(51) Int. Cl.
*H04L 27/00* (2006.01)

(52) U.S. Cl. .................. 375/259; 375/308; 375/329; 375/279; 348/553; 348/723; 348/725

(58) Field of Classification Search .................. 375/259, 375/261, 270, 279, 181, 295, 298, 301, 316, 375/354–355; 348/723–726, 553, 571, 729; 386/1, 37, 38, 46, 66, 117, 124
See application file for complete search history.

(56) References Cited

U.S. PATENT DOCUMENTS

| | | | |
|---|---|---|---|
| 4,996,718 A | 2/1991 | Shiomi | |
| 5,136,375 A * | 8/1992 | Citta et al. | 348/390.1 |
| 5,267,021 A | 11/1993 | Ramchandran et al. | |
| 5,412,351 A | 5/1995 | Nystrom et al. | |
| 5,477,199 A | 12/1995 | Montreuil | |
| 5,519,444 A | 5/1996 | Ko et al. | |

(Continued)

FOREIGN PATENT DOCUMENTS

JP 11234616 8/1999

OTHER PUBLICATIONS

"Loea Virtual Fiber Used for Elevated Distance Shots of Super Bowl XXXVII Technology Originally Developed for the Military", Press Release, Jan. 28, 2003, Loea Corporation, San Diego, CA.

*Primary Examiner*—Jean B Corrielus
(74) *Attorney, Agent, or Firm*—Lee & Hayes, PLLC

(57) ABSTRACT

Systems and methods for wireless transmission of uncompressed HDTV signals are disclosed. In one embodiment, a method for transmitting an uncompressed HDTV signal over a wireless RF link, comprises providing a stream of regenerated data from the uncompressed HDTV signal; providing a first clock signal synchronized to said stream of regenerated data; encoding said stream of regenerated data, producing a stream of encoded data; providing a second clock signal synchronized to said stream of encoded data; demultiplexing said stream of encoded data, using said second clock signal, into an I data stream and a Q data stream; modulating a carrier with said I data stream and said Q data stream; and transmitting said carrier in a signal over the wireless RF link.

12 Claims, 5 Drawing Sheets

U.S. PATENT DOCUMENTS

| | | | |
|---|---|---|---|
| 5,600,672 A * | 2/1997 | Oshima et al. | 375/219 |
| 5,881,107 A | 3/1999 | Termerinac et al. | |
| 6,091,702 A | 7/2000 | Saiki | |
| 6,185,255 B1 | 2/2001 | Twitchell et al. | |
| 6,314,289 B1 * | 11/2001 | Eberlein et al. | 455/427 |
| 6,621,366 B1 | 9/2003 | Gentile | |
| 7,065,153 B2 | 6/2006 | Bach et al. | |
| 7,110,048 B2 * | 9/2006 | Weiss | 348/723 |
| 2004/0100588 A1 | 5/2004 | Hartson et al. | |
| 2004/0223553 A1 | 11/2004 | Kumar | |

* cited by examiner

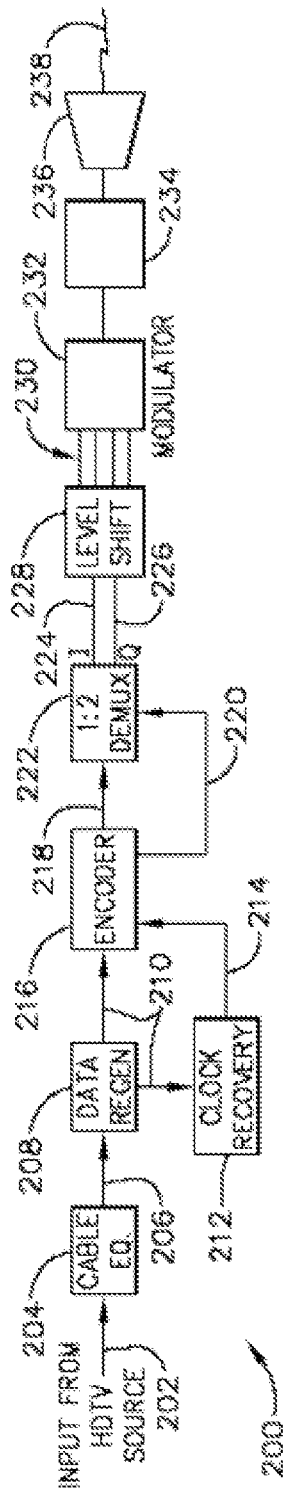
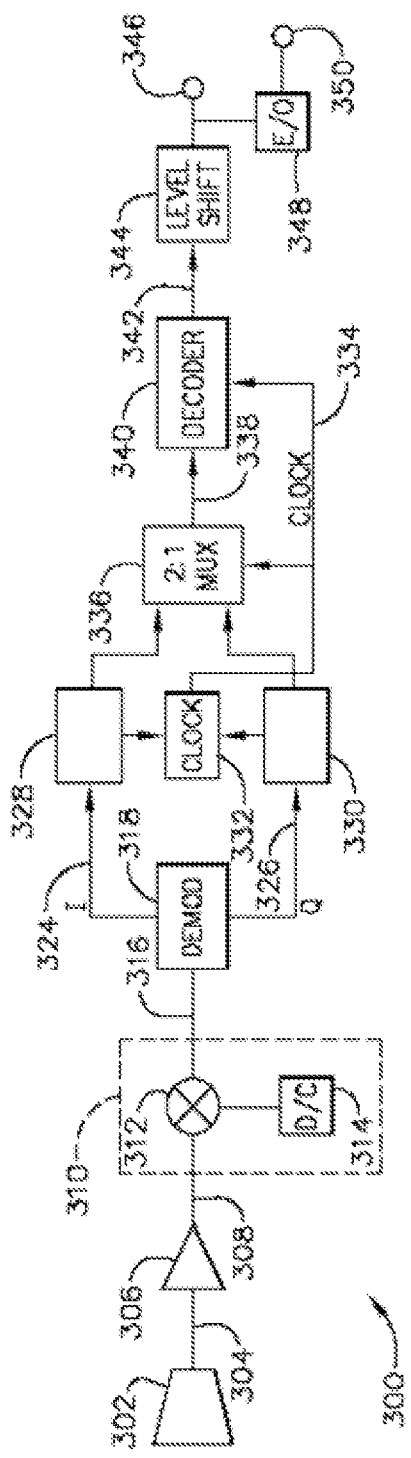
Fig. 3
Fig. 4

WIRELESS RF LINK FOR UNCOMPRESSED TRANSMISSION OF HDTV SIGNALS

CROSS-REFERENCE TO RELATED APPLICATIONS

This patent application is a continuation of, commonly-owned U.S. patent application Ser. No. 10/406,931 entitled "Wireless RF Link for Uncompressed Transmission of HDTV Signals" filed on Apr. 3, 2003, (now U.S. Pat. No. 7,139,319) which application is incorporated herein by reference.

FIELD OF THE INVENTION

The present invention generally relates to wireless radio frequency (RF) systems for RF transmission and reception of high definition television (HDTV) signals and, more particularly, to systems and methods for wireless transmission of uncompressed HDTV signals.

BACKGROUND OF THE INVENTION

Common approaches for RF transmission of HDTV signals digitally compress the HDTV signal to address problems due to bandwidth and modulation limitations. For example, uncompressed transmission of HDTV signals occurs at a data rate of 1.485 giga-bits per second (Gbps), a data rate that is too high to be accommodated by conventional, low-bandwidth RF transmission. Digital compression reduces the data rate so that conventional, low-bandwidth RF transmission can be used. The resulting HDTV signal may be decompressed at the destination or receiving end of the RF link. The signal compression and decompression can generate artifacts that degrade the signal quality, and begin to negate the high picture quality specified by HDTV. In addition, latency generated by compression/decompression, i.e., the time delay between generation of the uncompressed HDTV signal and reception of the decompressed HDTV signal after compression and decompression, creates a time delay unacceptable for live broadcast synchronization.

It can be impractical, however, to use current, lower bandwidth, wireless RF systems to transmit uncompressed HDTV signals because complex and costly modulation and coding schemes are required to achieve reasonable HDTV performance. The Society of Motion Pictures and Television Engineers (SMPTE) standard 292M defines the electrical characteristics of the high definition HDTV signal. SMPTE standards also define the acceptable transmission medium for HDTV. For example, fiber optic cable, coaxial cable, and RF wireless transmission are all acceptable transmission media for HDTV signals.

HDTV signal transmission, for example, at an event or filming site, using any of the current cable, fiber optic, or wireless RF transmission capabilities, is subject to a variety of shortcomings. For example, if fiber optic cables are used they usually must be pre-installed at the event or filming site. Cables generally require permits to be obtained in advance and the time and cost for installation of cables can impose constraints on televising the event or filming. Fiber optic cables can be aesthetically undesirable, frequently unsafe, and often logistically impossible. For example fiber optic cables are usually buried months in advance for some golf events, and television engineers complain that a major headache in covering stadium sports events is the problem of fans tripping over their cables. Wireless RF transmission typically suffers from the digital compression problems, as described above, due to the limited bandwidth available using conventional, low-bandwidth RF transmission.

Television studios are now in the process of converting all of their broadcast productions exclusively to HDTV. In order for a high definition RF camera system to provide the same functionality as standard definition (SD), it is necessary to use an uncompressed digital link. Using an uncompressed link eliminates delays introduced by compression encoding and decoding. Such delays are unacceptable because they introduce production difficulties. Although wireless RF transmission of uncompressed HDTV signals has been achieved, for example, at a recent Super Bowl event, the RF transmission of uncompressed HDTV signals has been accomplished using on/off keying modulation. On/off keying is an inefficient form of modulation which imposes several limitations, for example, limited range, and which requires employing extremely high frequency radio waves in the 71-76 gigahertz (GHz) range, also known as V band (40-75 GHz) and W band (75-110 GHz), in order to accommodate the high, 1.485 Gbps, data rate.

RF transmission at such extremely high frequencies, however, also entails a number of technical difficulties. Technical difficulties for extremely high frequency RF transmission may include, for example, distortion due to the bandwidth required for high data rate, providing adequate transmit power, limitations on range, and antenna design tradeoffs. Link designs must trade between distance, effective radiated power (ERP), bit error rate (BER) performance, forward error correction, link margin, and component availability to develop a usable system. These technical difficulties become more critical in a portable wireless RF transmission system. Using modulators and receivers capable of performing at the 1.485 Gbps rate, an HDTV signal from a source—such as an HDTV camera or recorder—could be transmitted uncompressed to the proper facility for production—such as a local studio facility. Portable systems for transmission of uncompressed HDTV signals over wireless RF links could allow a portable hand-held camera to move from location to location within the receiver range, making HDTV transmission of sporting events or electronic newsgathering in real time possible. The ability to connect real-time to studios for instant direction and editing could offer the prospect of greatly reduced cost and cycle time for content creation.

As can be seen, there is a need for transmitting and receiving uncompressed HDTV signals over a wireless RF link. Also there is a need for high bandwidth, wireless RF links allowing the transmission of HDTV digital signals at the full 1.485 Gbps rate, that can be realized in a portable system that provides a quick, easy set-up where one HDTV signal can be transmitted and received over each link.

SUMMARY OF THE INVENTION

In one aspect of the present invention, a method for transmitting and receiving an uncompressed HDTV signal over a wireless RF link includes providing a clock signal synchronized to the uncompressed HDTV signal; and providing a stream of regenerated data from the uncompressed HDTV signal, with the clock signal synchronized to the stream of regenerated data. The clock signal is then used for demultiplexing the stream of regenerated data into an I data stream and a Q data stream. The method further includes modulating a carrier with the I data and the Q data stream; transmitting the carrier over the wireless RF link; demodulating the carrier so that the I data stream and the Q data stream are recovered; multiplexing the I data stream and the Q data stream into a single stream of HDTV data; and recovering the uncompressed HDTV signal from the single stream of HDTV data.

In another aspect of the present invention, a method for transmitting an uncompressed HDTV signal over a wireless RF link includes: providing a stream of regenerated data from the uncompressed HDTV signal; providing a first clock signal synchronized to the stream of regenerated data; encoding the stream of regenerated data, producing a stream of encoded data; providing a second clock signal synchronized to the stream of encoded data; demultiplexing the stream of encoded data, using the second clock signal, into an I data stream and a Q data stream; modulating a carrier with the I data stream and the Q data stream; and transmitting the carrier over the wireless RF link.

In still another aspect of the present invention, a method for receiving an uncompressed HDTV signal over a wireless RF link includes steps of: receiving the carrier over the wireless RF link; demodulating the carrier so that the I data stream and the Q data stream are recovered; multiplexing the I data stream and the Q data stream into a single stream of HDTV data; and decoding the single stream of HDTV data so that the uncompressed HDTV signal is recovered.

In yet another aspect of the present invention, a method for transmitting and receiving an uncompressed HDTV signal over a wireless RF link includes steps of: providing a stream of regenerated data having a first data rate of 1.485 Gbps from the uncompressed HDTV signal; providing a first clock signal, using edge detection of the stream of regenerated data to generate the first clock signal, and synchronize it to the stream of regenerated data; encoding the stream of regenerated data using a forward error correction code, producing a stream of encoded data having a second data rate higher than the first data rate by a coding overhead of the forward error correction code; providing a second clock signal using edge detection of the stream of encoded data to generate the second clock signal synchronized to the stream of encoded data, the second clock signal having a rate higher than the first clock signal by the coding overhead; demultiplexing the stream of encoded data, using the second clock signal, into an I data stream and a Q data stream; and QPSK modulating an IF carrier with the I data stream and the Q data stream.

The method also includes steps of: up converting the IF carrier to an RF carrier; transmitting the RF carrier over the wireless RF link; receiving the RF carrier over the wireless RF link; down converting the RF carrier to an IF frequency signal having frequency greater than 1.5 GHz and less than 6 GHz; demodulating the IF frequency signal so that the I data stream and the Q data stream are recovered; generating a third clock signal from the I data stream and the Q data stream, the third clock signal synchronized to the I data stream and the Q data stream; multiplexing the I data stream and the Q data stream, using the third clock signal, into a single stream of HDTV data; and decoding the single stream of HDTV data, using the third clock signal, so that the uncompressed HDTV signal is recovered.

In a further aspect of the present invention, a method of providing a wireless RF link for an HDTV system includes steps of: performing data regeneration on an uncompressed HDTV signal that produces a stream of regenerated HDTV data; synchronizing a first clock signal to the stream of regenerated HDTV data; encoding the stream of regenerated HDTV data, producing a stream of encoded data; synchronizing a second clock signal to the stream of encoded data; demultiplexing the stream of encoded data, using the second clock signal, into an I data stream and a Q data stream; and modulating a carrier with the I data stream and the Q data stream. The method further includes steps of: transmitting the carrier over the wireless RF link; receiving the carrier over the wireless RF link; demodulating the carrier so that the I data stream and the Q data stream are recovered; generating a third clock signal from the I data stream and the Q data stream, the third clock signal being synchronized to the I data stream and the Q data stream; using the third clock signal to multiplex the I data stream and the Q data stream into a single stream of HDTV data; and decoding the single stream of HDTV data so that the uncompressed HDTV signal is recovered.

These and other features, aspects and advantages of the present invention will become better understood with reference to the following drawings, description and claims.

BRIEF DESCRIPTION OF THE DRAWINGS

Embodiments of the present invention are described in detail below with reference to the following drawings.

FIG. 3 is a block diagram illustrating transmission of uncompressed HDTV signals, according to an embodiment of the present invention;

FIG. 4 is a block diagram illustrating single-polarization reception of uncompressed HDTV signals, according to one embodiment of the present invention;

DETAILED DESCRIPTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, embodiments of the present invention provide systems and methods for transmitting and receiving uncompressed high definition television (HDTV) signals over a wireless RF link. The HDTV digital signals may be generated, for example, from an HDTV camera, stored HDTV source or memory, or recorded images. One embodiment provides high bandwidth, wireless RF links allowing the transmission of HDTV digital signals at the full 1.485 gigabit per second (Gbps) rate, according to the Society of Motion Pictures and Television Engineers (SMPTE) standard 292M, for a portable system where one HDTV signal can be transmitted and received over each link. One embodiment may incorporate high-speed modulation to achieve line of sight RF links up to 10 kilometers in range. Such high speed modulation is described in U.S. patent application Ser. No. 10/071,954, now U.S. Pat. No. 7,065,153 filed Feb. 6, 2002, titled "High Speed QPSK MMIC and QAM Modulator", having assignee in common with the present invention, and incorporated herein by reference. One embodiment may also incorporate an apparatus for wireless RF transmission of uncompressed HDTV signals as described in now abandoned U.S. patent application Ser. No. 10/408,002, filed Apr. 3, 2003, having assignee in common with the present invention, and incorporated herein by reference.

HDTV systems as specified by SMPTE standard 292M are clockless systems, i.e., the HDTV signal is not accompanied by a synchronous clock. In one embodiment of the present invention, clock synchronization is provided to an HDTV signal so that efficient modulation schemes—such as QPSK and QAM—may be used to modulate the RF carrier with the HDTV data. Thus, the high data rate HDTV data at 1.485 Gbps may be efficiently modulated so that less bandwidth is required to transmit the signal over an RF link in accordance with an embodiment of the present invention. Therefore, in contrast to the prior art, RF links in accordance with an embodiment of the present invention may operate at a variety of frequency bands from 18 GHz up to 110 GHz. The RF links may be implemented as fixed or portable operation, and links may be one way (simplex) or full two-way (duplex). HDTV signals may be transmitted on the RF links from cameras or other HD sources to recorders, local studio facilities, or between studios for processing or distribution.

Figure 1:
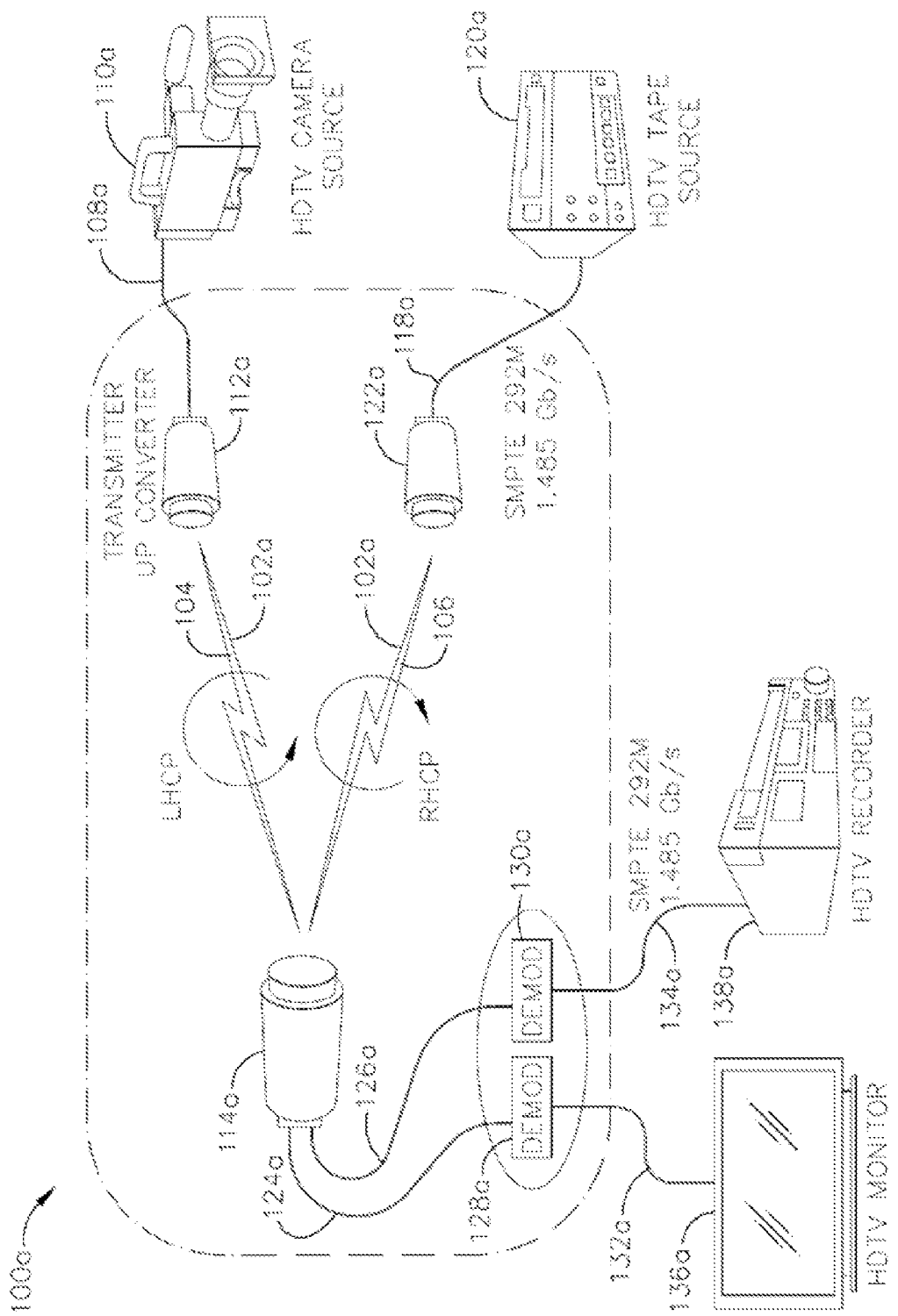
FIG. 1 is a system diagram showing an exemplary HDTV system using dual polarization (i.e. frequency re-use) to transmit two uncompressed HDTV signals over a single RF channel, according to an embodiment of the present invention.
Figure 2:
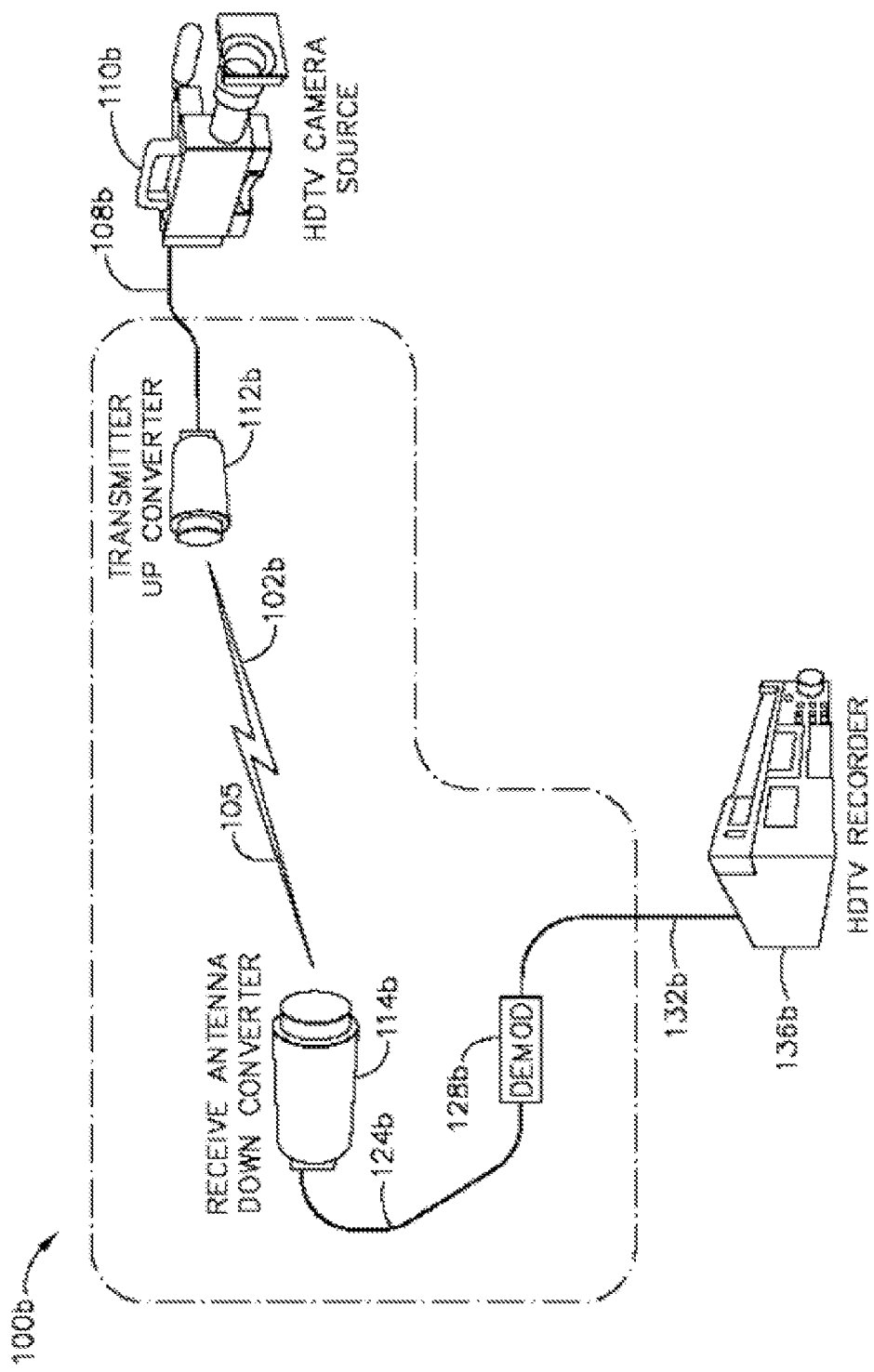
FIG. 2 is a system diagram showing an exemplary HDTV system with a wireless RF link transmitting uncompressed HDTV signals, according to an embodiment of the present invention.

Referring now to FIGS. 1 and 2, FIG. 1 illustrates an exemplary HDTV system 100a according to one embodiment and FIG. 2 illustrates an exemplary HDTV system 100b according to another embodiment. System 100a may include an RF channel 102a. A dual polarization technique may be used with RF channel 102a to provide signal transmission via left-hand circular polarization (LHCP) 104 and right-hand circular polarization (RHCP) 106 for frequency re-use over a single channel. System 100b may include an RF channel 102b. A single polarization or a conventional technique may be used with RF channel 102b, allowing one signal to be transmitted over the RF channel 102b.

System 100a may transmit an uncompressed HDTV signal 108a from source 110a, which may be, for example, an HDTV camera as shown in FIG. 1. System 100a may transmit uncompressed HDTV signal 108a using transmitter 112a with the dual polarization technique to provide transmission via LHCP 104 over RF channel 102a to receiver 114a. Similarly, system 100a may transmit an uncompressed HDTV signal 118a from source 120a, which may be, for example, an HDTV tape source as shown in FIG. 1. System 100a may transmit uncompressed HDTV signal 118a using transmitter 122a with the dual polarization technique to provide transmission via RHCP 106 over RF channel 102a to receiver 114a. HDTV signals 108a and 118a may conform to SMPTE standard 292M, and may have a data rate of 1.485 Gbps.

Receiver 114a may provide the received signal 124a corresponding to uncompressed HDTV signal 108a transmitted via LHCP 104, using dual polarization technique, over RF channel 102a to demodulator 128a. Similarly, receiver 114a may provide the received signal 126a corresponding to uncompressed HDTV signal 118a transmitted via RHCP 106, using dual polarization technique, over RF channel 102a to demodulator 130a. Demodulator 128a may provide an HDTV signal 132a to an HDTV device 136a, which may be, for example, an HDTV monitor as shown in FIG. 1. Demodulator 130a may provide an HDTV signal 134a to an HDTV device 138a, which may be, for example, an HDTV recorder as shown in FIG. 1. HDTV signals 132a and 134a may conform to Society of Motion Pictures and Television Engineers (SMPTE) standard 292M, and may have a data rate of 1.485 Gbps. HDTV signals 132a and 134a may be recovered, respectively, from HDTV signals 108a and 118a.

Single channel system 100b is simpler but operates similarly to system 100a. Thus, system 100b may transmit an uncompressed HDTV signal 108b from source 110b, which may be, for example, an HDTV camera as shown in FIG. 2. System 100b may transmit uncompressed HDTV signal 108b using transmitter 112b, using conventional or single polarization techniques, over the link 105 of RF channel 102b to receiver 114b. HDTV signal 108b may conform to Society of Motion Pictures and Television Engineers (SMPTE) standard 292M, and may have a data rate of 1.485 Gbps.

Receiver 114b may provide the received signal 124b corresponding to uncompressed HDTV signal 108b received over link 105 of RF channel 102b to demodulator 128b. Demodulator 128b may provide an HDTV signal 132b to an HDTV device 136b, which may be, for example, an HDTV recorder as shown in FIG. 2. HDTV signal 132b may conform to Society of Motion Pictures and Television Engineers (SMPTE) standard 292M, and may have a data rate of 1.485 Gbps. HDTV signal 132b may be recovered from HDTV signal 108b.

Referring now to FIG. 3, transmission system 200 illustrates RF transmission of an uncompressed HDTV signal 202—such as signal 108a or 108b seen in FIGS. 1 and 2—according to one embodiment. Uncompressed HDTV signal 202 may be equalized at module 204 to compensate for any cable distortions due to cable length or type that, for example, may cause signal 202 to not meet SMPTE 292M requirements. For example, equalization may be performed using commercially available equalization devices, as known in the art, so that equalized signal 206 meets the SMPTE 292M requirements. Data from equalized signal 206 may be regenerated at module 208 to provide regenerated data 210 so that a clock signal 214 synchronized to regenerated data 210 may be provided by clock 212. For example, clock recovery at clock 212 may be provided by edge-detection of regenerated data 210. Also, for example, clock recovery at clock 212 may be provided by passing regenerated data 210 through a squaring multiplier to generate a clock signal 214 synchronized to regenerated data 210.

Regenerated data 210 and clock signal 214 may be used to perform forward error correction coding (FEC) at module 216 to improve link performance. For example, Reed-Solomon coding, interleaving coding, or turbo product codes (TPC), as known in the art, may be used. FEC coding at module 216 requires adding redundancy to the signal (i.e. coding overhead) by intentionally adding bits to correct errors at the receiver without having to communicate back and forth with the transmitter for additional information on which bits are in error. Depending on the type of code used this can entail a coding overhead due to the additional capacity, increasing the data rate. Thus, encoded data 218 may be provided at a higher data rate, for example, 1.607 Gbps, and clock signal 220 is provided at the higher rate to match the higher rate encoded data 218, so that the rate of clock signal 220 is higher than the rate of clock signal 214 by the coding overhead. For example, a phase-locked loop (PLL) included in module 216 may be used to generate the higher rate clock signal 220 and synchronize clock signal 220 to encoded data 218.

Clock signal 220 may be used as a timing source to demultiplex encoded data 218 into two data streams, an in-phase (I) data stream 224 and a quadrature (Q) data stream 226 at block 222 as shown in FIG. 3. The two synchronized data streams 224 and 226, which contain the data of the original uncompressed HDTV signal 202, may be used to provide efficient modulation of a carrier by the data of signal 202. For example, the amplitude and offset of the voltages representing the data streams 224 and 226 may be adjusted as illustrated by block 228 and appropriate inputs 230 may be provided to a modulator 232. Modulator 232 may be, for example, a quadrature phase shift keying (QPSK) or quadrature amplitude modulation (QAM) implementation on a monolithic microwave integrated circuits (MMIC) chip, as described above. For example, an oscillator (i.e. frequency source) may provide the center frequency at which modulator 232 operates, typically between 18 GHz and 23 GHz depending on frequency upconversion spur analysis, as known in the art. Modulator 232 output may be a QPSK waveform that may then be frequency upconverted at block 234 to an appropriate transmit frequency. The frequency translation at block 234 may combine a QPSK waveform with a converting oscillator to generate a desired transmit frequency. For example, the minimum required bandwidth necessary for a 1.485 Gbps QPSK waveform with error correction coding overhead may be approximately 900 MHz. The modulated carrier 238 may be broadcast by an antenna 236 over a wireless RF link—such as link 102a or 102b, seen in FIGS. 1 and 2.

Figure 5:
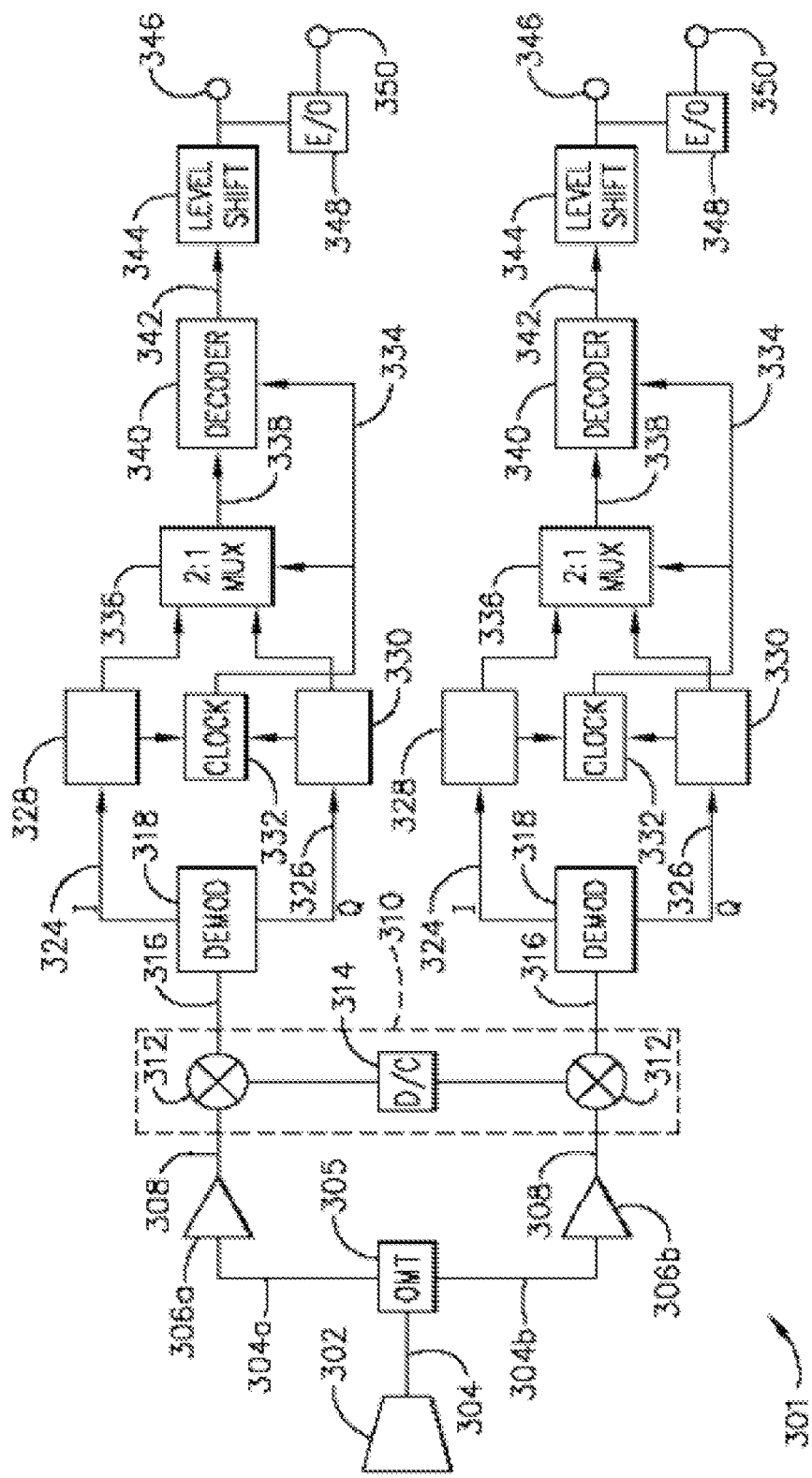
FIG. 5 is a block diagram illustrating dual polarization signal reception of uncompressed HDTV signals over a single channel, according to another embodiment of the present invention.

Referring now to FIGS. 4 and 5, reception system 300 shown in FIG. 4, illustrates RF reception, according to one embodiment, of an uncompressed HDTV signal—such as signal 108a or 108b seen in FIGS. 1 and 2—that may be transmitted via a modulated carrier—such as modulated carrier 238—that may be received by a receiving antenna 302. The received uncompressed HDTV signal 304 may be passed to a low noise amplifier (LNA) 306.

In an alternative embodiment, illustrated by reception system 301 in FIG. 5, uncompressed HDTV signal 304 may comprise an LHCP signal 304a and an RHCP signal 304b— such as signals 108a and 118a sent over a single RF channel 102a using a dual polarization technique. The two signals, LHCP signal 304a and RHCP signal 304b, may be separated by an ortho-mode transducer 305, so that LHCP signal 304a may be passed to low noise amplifier (LNA) 306a and RHCP signal 304b may be passed to low noise amplifier (LNA) 306b. The alternative embodiment shown in FIG. 5 uses dual polarization to allow two transmitters to broadcast to a single receiver site. The two transmitters must operate on different polarizations, right-hand circular and left-hand circular, in order to take advantage of frequency reuse. The receive antenna utilizes an ortho-mode transducer 305 to separate the left and right polarization for low noise amplification, frequency down conversion, and data recovery. This method allows for transmitting two signals each from a different transmitter over the same frequency region. The single polarization down converter of the embodiment shown in FIG. 4 may simplify the electronics for single channel use.

Referring again to FIGS. 4 and 5, the amplified signal 308 may be down converted at block 310 by multiplying amplified signal 308, for example, using a multiplier 312 by the output of a local oscillator—such as local oscillator 314—to produce a down converted intermediate frequency (IF) signal or carrier 316 at a lower frequency than that of signal 304. For example, an IF between 1.5 GHz and 6 GHz may typically be chosen, so that a 2-GHz IF may be chosen to illustrate the present embodiment. In a practical implementation, for example, the functions of receiving antenna 302, LNA 306, and frequency down conversion of block 310 may be remotely located to provide optimum line-of-sight to a transmitter—such as transmitter 112a shown in FIG. 1. The correct local oscillator source—such as local oscillator 314— may be combined with the incoming RF signal 308 to shift the signal 308 down to a 2 GHz IF carrier 316 at the output of block 310. Since the transmit frequency may not be fixed there can be numerous values for the local oscillator 314 in order to achieve the 2 GHz for IF carrier 316. A 2-GHz IF may be selected, for example, for simplification of routing. A 2-GHz IF may allow for significant distance between the receive antenna, which could be located on a crane or pole, and the baseband hardware, used to implement demodulation and decoding as further described below, located on the ground. A 2-GHz IF signal output can typically drive up to 100 feet of coaxial cable or be converted to an optical signal.

IF carrier 316 may be passed to demodulator 318 for recovery of the baseband digital signals corresponding to I data stream 224 and Q data stream 226. Demodulator 318, for example, may take a coherent carrier recovered from IF carrier 316 and mix the coherent carrier with the modulated IF carrier 316 to generate baseband I data stream 324 and Q data stream 326.

Bit synchronization and clock recovery may be performed on I data stream 324 and Q data stream 326, respectively, at blocks 328 and 330 to generate a clock 332 that is synchronized with I data stream 324 and Q data stream 326. Clock 332 may provide clock signal 334, providing a timing source for the 2:1 multiplexing at block 336 multiplexing I data stream 324 and Q data stream 326 to obtain a single stream of encoded HDTV data 338 corresponding to encoded data 218. Single stream of HDTV data 338 may be provided at a rate of 1.485 Gbps plus coding overhead. For example, the data rate with coding overhead given in the example above for encoded data 218 was 1.607 Gbps and, following that example, the data rate of single stream of HDTV data 338 may also be 1.607 Gbps. The encoded HDTV signal, i.e., HDTV data 338, may be supplied a timing source from clock signal 334, for example, at block 340, for decoding single stream of encoded HDTV data 338 to generate the error corrected 1.485 Gbps HDTV signal 342.

The logic levels of error corrected HDTV signal 342 may be shifted, for example, at block 344 after decoding to provide appropriate logic levels for adapting HDTV signal 342 to drive an electrical interface 346 or electrical to optical conversion may be performed at block 348 to drive optical interface 350.

Figure 6:
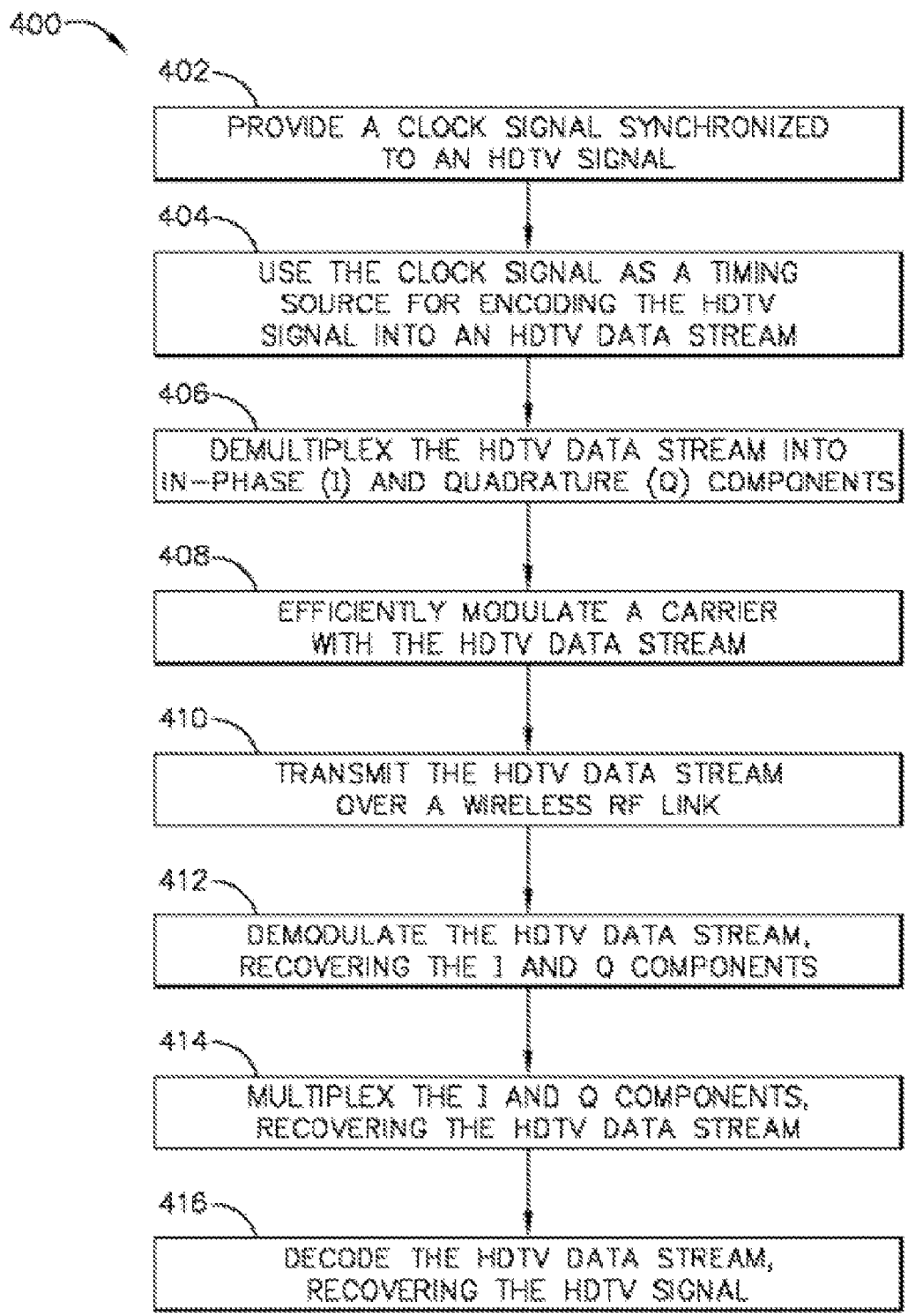
FIG. 6 is a flow chart illustrating a method for transmitting and receiving uncompressed HDTV signals, in accordance with an embodiment of the present invention.

Referring now to FIG. 6, an exemplary embodiment of a method 400 for transmitting and receiving an uncompressed HDTV signal—such as signal 108a or 108b seen in FIGS. 1 and 2—is illustrated in flowchart form. Exemplary method 400 may include blocks 402, 404, 406, 408, 410, 412, 414, and 416, which conceptually delineate method 400 for purposes of conveniently illustrating method 400 according to one embodiment. Exemplary method 400 is illustrated with reference to FIGS. 3, 4 and 5.

Method 400 may begin at block 402, in which a clock signal may be synchronized to an HDTV signal. For example, data regeneration of equalized HDTV signal 206, or HDTV signal 108a or 108b, may be used with edge detection to provide synchronized clock signal 214.

Method 400 may continue with block 404, in which a synchronized clock signal may be used as a timing source for an encoder to encode the HDTV signal into an encoded data stream. For example, forward error correction coding—such as Reed-Solomon coding or turbo product coding—may be performed, in which synchronized clock signal 214 may be used as a timing source for the encoder to provide a stream of encoded data 218 from HDTV signal 206. A higher rate clock signal 220 may be generated from encoder block 216 using a PLL, in which higher clock rate signal 220 may be synchronized to the higher rate stream of encoded data 218.

Method 400 may continue with block 406, in which the encoded HDTV data stream may be demultiplexed into I and Q data streams. For example, higher rate synchronized clock signal 220 may enable demultiplexing of stream of encoded data 218 into I data stream 224 and Q data stream 226.

Method 400 may continue with block 408, in which an RF carrier may be efficiently modulated by the HDTV data stream. For example, an RF carrier may be QPSK modulated by I data stream 224 and Q data stream 226 to provide modulated carrier 238. Other types of efficient modulation may also be used, for example, 16 QAM or other higher orders of modulation.

Method 400 may continue with block 410, in which the HDTV data stream may be transmitted over a wireless RF link. For example, modulated carrier 238 may be transmitted from a transmit antenna 236 to a receiving antenna 302.

Method 400 may continue with block 412, in which an HDTV data stream may be demodulated from a carrier to recover I and Q data streams. For example, an IF carrier 316 may be demodulated to recover an I data stream 324 and a Q data stream 326.

Method 400 may continue with block 414, in which I and Q data streams may be multiplexed into a single encoded HDTV data stream. For example, I data stream 324 and Q data stream 326 may be multiplexed into a single stream of encoded HDTV data 338, which effectively recovers the transmitted encoded data 218. I data stream 324 and Q data stream 326 may be multiplexed with the aid of a clock signal 334 generated by clock data recovery using edge detection, for example, from I data stream 324 and Q data stream 326.

Method 400 may continue with block 416, in which HDTV data stream may be decoded into an error corrected HDTV signal—such as HDTV signal 342, meeting the SMPTE 292M standard—that effectively recovers the original HDTV signal—such as signal 108a or 108b.

While preferred and alternate embodiments of the invention have been illustrated and described, as noted above, many changes can be made without departing from the spirit and scope of the invention. Accordingly, the scope of the invention is not limited by the disclosure of these preferred and alternate embodiments. Instead, the invention should be determined entirely by reference to the claims that follow.

What is claimed is:

1. A method for transmitting an uncompressed high definition television (HDTV) signal over a wireless radio frequency link via a recording device, comprising:
    providing a stream of regenerated data from the uncompressed HDTV signal;
    providing a first clock signal synchronized to the stream of regenerated data;
    encoding the stream of regenerated data using the first clock signal to produce a stream of encoded data;
    providing a second clock signal synchronized to the stream of encoded data;
    demultiplexing the stream of encoded data, using the second clock signal, into an in-phase data stream and a quadrature data stream;
    modulating a carrier with the in-phase data stream and the quadrature data stream via a modulator of the recording device; and
    transmitting the carrier in a signal over the wireless radio frequency link.

2. The method of claim 1, wherein:
    encoding the stream of regenerated data comprises using a forward error correction code;
    the stream of regenerated data has a first data rate of 1.485 giga-bits per second;
    the stream of encoded data has a second data rate higher than the first data rate by a coding overhead of the forward error correction code; and
    the second clock signal has a rate higher than the first clock signal by the coding overhead.

3. The method of claim 1, wherein providing the first clock signal synchronized to the stream of regenerated data comprises using edge detection of the stream of regenerated data to generate the first clock signal.

4. The method of claim 1, wherein providing the first clock signal synchronized to the stream of regenerated data comprises using a "times-2" multiplier with the stream of regenerated data to generate the first clock signal.

5. The method of claim 1, wherein providing the second clock signal is performed using a phase-locked loop that synchronizes the second clock signal to the stream of encoded data.

6. The method of claim 1, wherein encoding the stream of regenerated data comprises Reed-Solomon forward error correction coding.

7. The method of claim 1, wherein modulating the carrier comprises quadrature phase shift keying modulation of an intermediate frequency carrier by the in-phase data stream and the quadrature data stream and frequency upconversion of the intermediate frequency carrier to the carrier.

8. The method of claim 1, wherein transmitting the carrier in the signal comprises transmitting the signal with a circular polarization.

9. A method for communicating an uncompressed high definition television (HDTV) signal over a wireless link, comprising:
    providing a stream of regenerated data from the uncompressed HDTV signal;
    providing a first clock signal synchronized to the stream of regenerated data;
    encoding the stream of regenerated data using the first clock signal to produce a stream of encoded data;
    providing a second clock signal synchronized to the stream of encoded data;
    demultiplexing the stream of regenerated data using the second clock signal into an in-phase data stream and a quadrature data stream;
    modulating a carrier with the in-phase data stream and the quadrature data stream;
    transmitting the carrier in a signal over the wireless link;
    demodulating the carrier to recover the in-phase data stream and the quadrature data stream via a demodulator of a receiving device;
    multiplexing the recovered in-phase data stream and the quadrature data stream into a single stream of HDTV data; and
    recovering the uncompressed HDTV signal from the single stream of HDTV data.

10. The method of claim 9, wherein providing the second clock signal synchronized to the stream of encoded data comprises using a phase-locked loop to generate the second clock signal.

11. The method of claim 9, wherein encoding the stream of regenerated data comprises forward error correction coding.

12. The method of claim 9, where demodulating the carrier includes:
    separating an left-hand circular polarization signal from an right-hand circular polarization signal;
    recovering a first uncompressed HDTV signal from the left-hand circular polarization signal; and
    recovering a second uncompressed HDTV signal from the right-hand circular polarization signal.

* * * * *